United States Patent [19]

Dickman et al.

[11] 4,364,165
[45] Dec. 21, 1982

[54] LATE PROGRAMMING USING A SILICON NITRIDE INTERLAYER

[75] Inventors: John E. Dickman, Russiaville; William B. Donley, Kokomo, both of Ind.

[73] Assignee: General Motors Corporation, Detroit, Mich.

[21] Appl. No.: 268,088

[22] Filed: May 28, 1981

[51] Int. Cl.³ .............................................. H01L 21/22
[52] U.S. Cl. ................... 29/571; 29/576 B; 29/577 C; 29/578; 148/187
[58] Field of Search ............... 29/571, 576 B, 578, 29/577 C; 148/187

[56] References Cited

U.S. PATENT DOCUMENTS

| | | | |
|---|---|---|---|
| 3,475,234 | 10/1969 | Kerwin et al. | 148/187 |
| 3,751,722 | 8/1973 | Richman | 357/41 |
| 3,775,191 | 11/1973 | McQuhae | 148/1.5 |
| 3,816,905 | 6/1974 | Bernard et al. | 29/571 |
| 3,914,855 | 10/1974 | Cheney et al. | 29/571 |
| 3,917,495 | 11/1975 | Horn | 148/187 |
| 4,080,718 | 3/1978 | Richman | 29/571 |
| 4,091,406 | 5/1978 | Lewis | 357/54 |
| 4,103,415 | 8/1978 | Hayes | 29/571 |
| 4,129,936 | 12/1978 | Takei | 29/571 |
| 4,151,020 | 4/1979 | McElroy | 148/187 |
| 4,198,693 | 4/1980 | Kuo | 29/571 X |
| 4,235,011 | 11/1980 | Butler et al. | 29/577 C |
| 4,267,632 | 5/1981 | Shappir | 29/571 |
| 4,294,001 | 10/1981 | Kuo | 29/576 B |
| 4,295,209 | 10/1981 | Donley | 357/91 X |

*Primary Examiner*—G. Ozaki
*Attorney, Agent, or Firm*—Robert J. Wallace

[57] ABSTRACT

A method of making a ROM and encoding it late in the method. A silicon nitride layer etch mask is used for encoding by ion implantation, avoiding the need for a separate encoding mask.

5 Claims, 24 Drawing Figures

P-TYPE SILICON

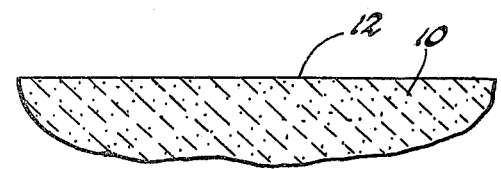
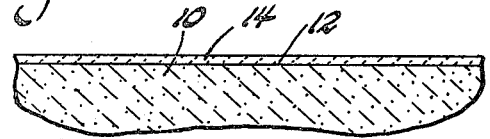
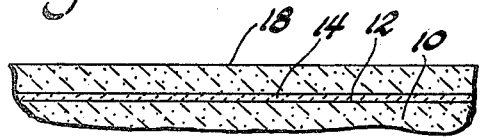
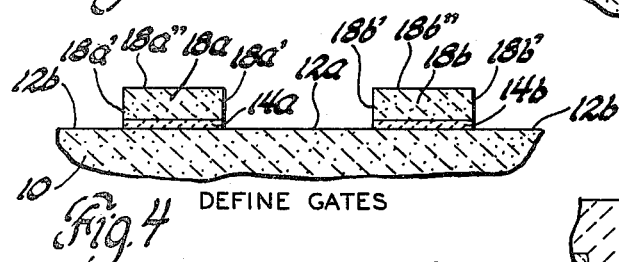
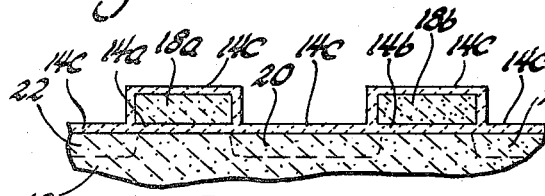
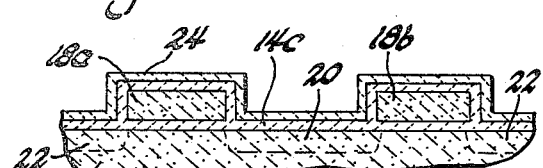
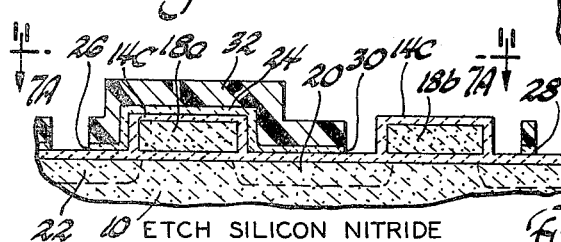
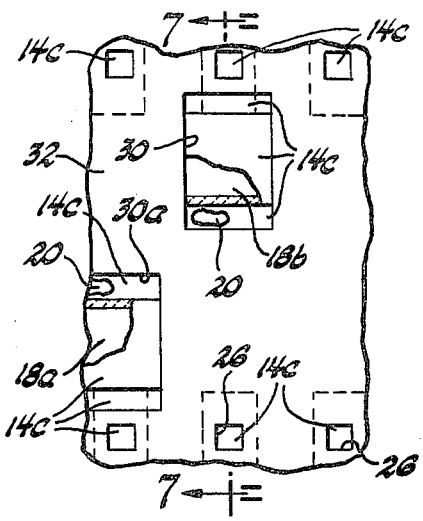
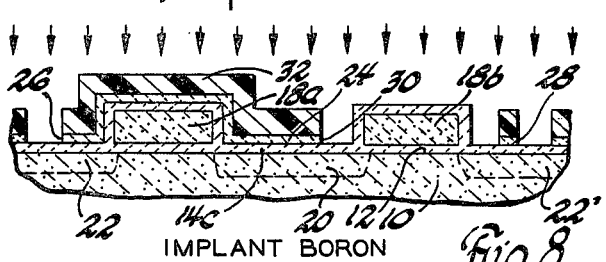
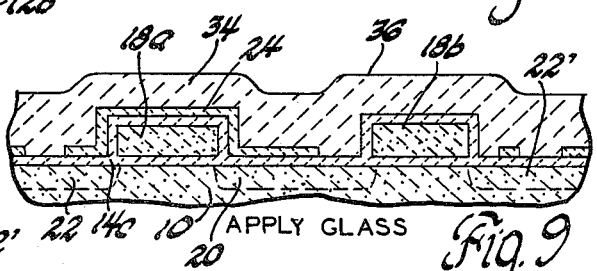
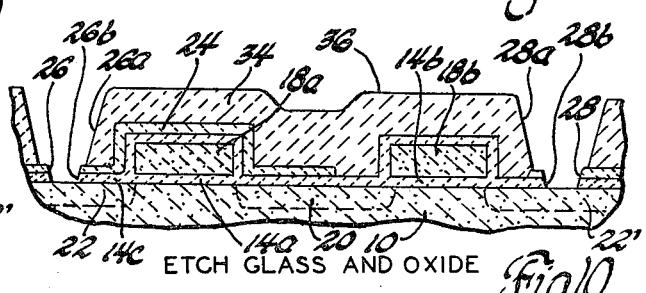
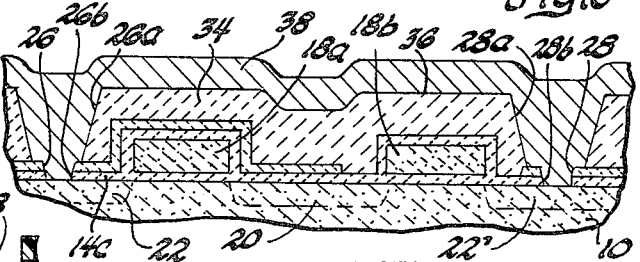

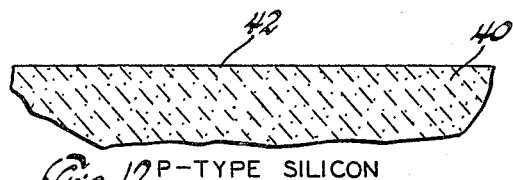
Fig. 12 P-TYPE SILICON
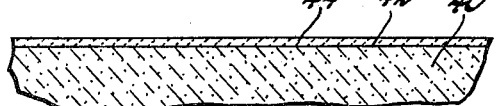
Fig. 13 OXIDIZE
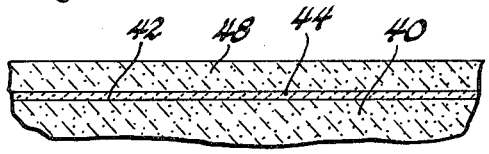
Fig. 14 DEPOSIT POLY-SILICON
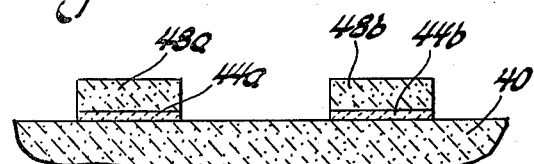
Fig. 15 DEFINE GATES
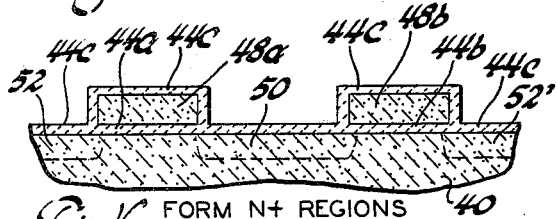
Fig. 16 FORM N+ REGIONS
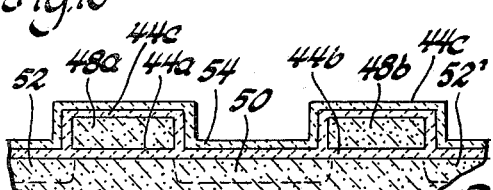
Fig. 17 DEPOSIT SILICON NITRIDE
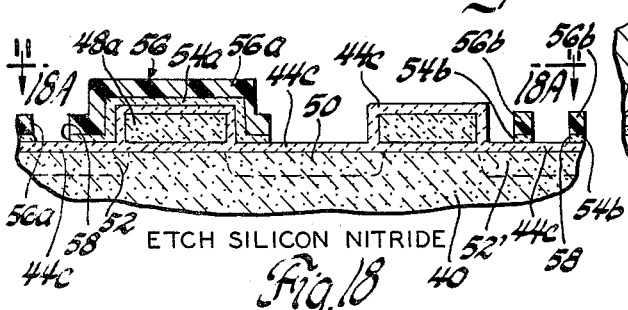
Fig. 18 ETCH SILICON NITRIDE
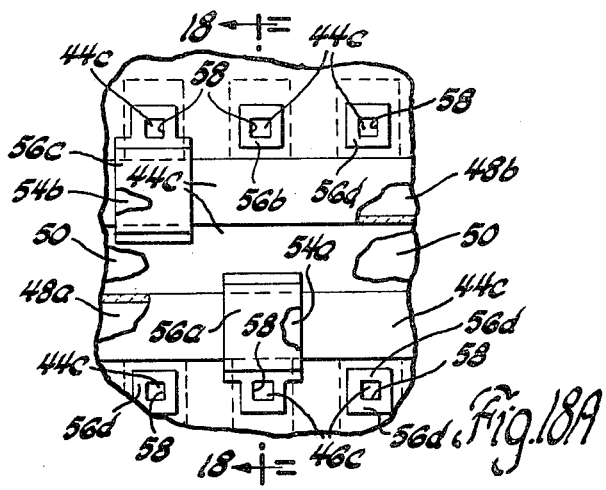
Fig. 18A
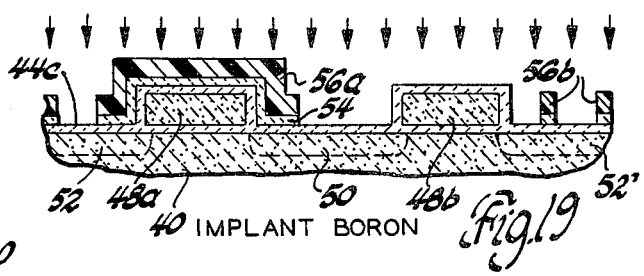
Fig. 19 IMPLANT BORON
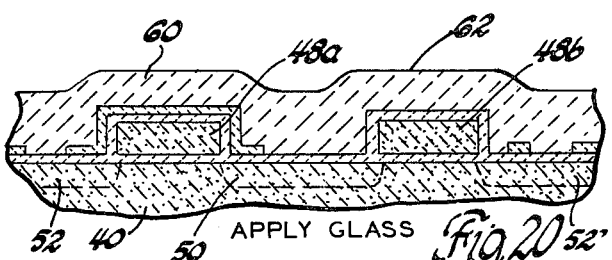
Fig. 20 APPLY GLASS
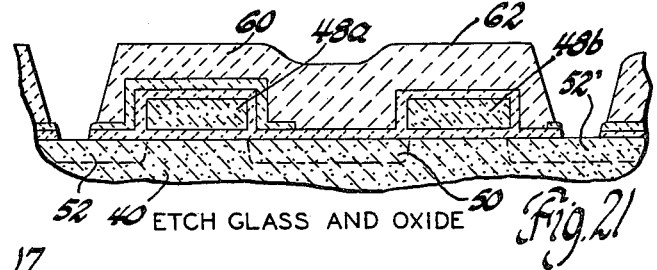
Fig. 21 ETCH GLASS AND OXIDE
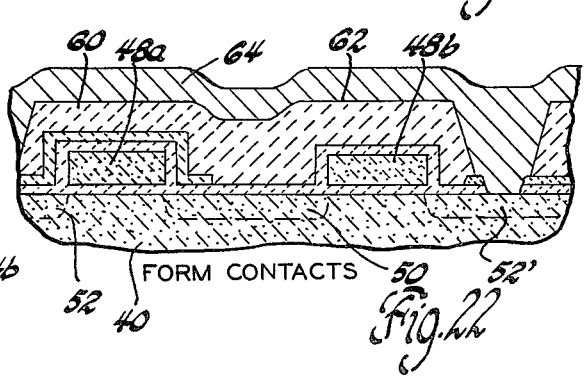
Fig. 22 FORM CONTACTS

LATE PROGRAMMING USING A SILICON NITRIDE INTERLAYER

RELATED PATENT APPLICATIONS

This invention is related to the following patent applications that we filed herewith and are assigned to the assignee hereof:

Ser. No. 268,086 LATE PROGRAMMING ENHANCED CONTACT ROM
Ser. No. 268,090 SINGLE LEVEL POLY LATE PROGRAMMABLE ROM
Ser. No. 268,089 LATE PROGRAMMING USING SECOND LEVEL POLYSILICON MASK

This invention is also related to the previously filed U.S. Ser. No. 098,211, now U.S. Pat. No. 4,295,209 that is entitled "Programming an IGFET Read-Only-Memory" and was filed Nov. 28, 1979.

FIELD OF THE INVENTION

This invention relates to a method of late programming a read-only memory (ROM) on a semiconductor chip by ion implantation through polycrystalline silicon ROM gates. More specifically, it involves blocking selected ROM gates from a blanket ion implantation by means of a mask formed by the photoresist used to define a silicon nitride interlayer.

BACKGROUND OF THE INVENTION

The above-mentioned U.S. Pat. No. 4,295,209 discloses late programming by IGFET ROM by ion implantation. By IGFET, we mean an insulated gate field effect transistor. The ROM comprises an orderly array of such transistors. The IGFETs are ordinarily arranged on a common silicon substrate in a pattern such that the gates of individual transistors are aligned in a number of parallel input rows. The drains of individual devices are aligned in a plurality of parallel columns. In a typical array of horizontal-type IGFETs, all IGFET drains can be contacted by a metallization pattern of parallel conductor output strips that overlie and, in plan view, are orthogonal to a pattern of parallel polycrystalline silicon gate input strips.

The aforementioned U.S. Pat. No. 4,295,209 discloses programming the ROM by ion implantation through the polycrystalline silicon gate strips just before metallization, using a reflowable glass layer as a mask. In substance, all ROM gates are potentially active when the polycrystalline silicon gate strips are defined. A blanket silicon nitride coating is applied over all the polycrystalline silicon gate strips, and contact openings etched in it. A blanket reflowable glass coating is applied over the silicon nitride coating, and corresponding contact openings etched in it. However, concurrently, ion implant windows are also etched in the glass coating, over selected ROM gates. No addition masks are needed to perform the ion implantation since two masks are ordinarily needed anyway, to etch first through the glass and then through the underlying thermal oxide. The silicon nitride coating provides an insulating coating over the gate strip portion exposed within the ion implant window. Accordingly, metal drain strips can be applied over the glass in the usual manner. They can pass directly over the selected gate ion implant windows without electrically shorting to the gate strip in the window. Thus, not only is the late programming achieved but high ROM layout density is preserved. The silicon nitride also provided better protection against gate-drain shorts due to excessive lateral etching and pin-holing of the glass.

On the other hand, in U.S. Pat. No. 4,295,209 the metal drain strips and the gate strip portions overlap within the ion implant windows with only a thin layer of dielectric therebetween. This generates a parasitic capacitance. In small ROM arrays the cumulative effect of this parasitic capacitance is not particularly significant. However, in large ROM arrays it can accumulate sufficiently to significantly slow down ROM operating speed.

We have now discovered how to improve this process by minimizing the parasitic capacitance. Late programming and electrical shorts protection is still obtained, without increasing ROM size.

In the aforementioned patent application Ser. No. 268,090, we propose to obtain both minimum parasitic capacitance and high ROM density by applying the U.S. Pat. No. 4,295,209 programming process to a ROM of unique configuration. In the aforementioned patent application Ser. No. 268,089, we propose using a second polycrystalline silicon level as an ion implantation mask, whereby the subsequently applied phosphosilicate glass layer can be retained over all IGFET channels. In the aforementioned patent application Ser. No. 268,086, we propose to program before the glass layer is applied by using an enhancement contact mask in combination with a second level polycrystalline silicon layer. In the present patent application, we propose to program before the glass layer is applied in still a different way. We propose to use the silicon nitride layer of U.S. Pat. No. 295,209 and the photoresist used to define it as an ion implantation mask. These techniques provide programming capability late in the process of manufacture with (a) adding another mask to the number of masks already needed to produce that product, (b) altering conventional processes, (c) expanding ROM size, or (d) decreasing ROM speed.

OBJECTS AND SUMMARY OF THE INVENTION

It is, therefore, an object of this invention to provide an improved late programming manufacturing method for an IGFET ROM, that permits both minimal capacitance and high density to be achieved.

Another object of the invention is to provide an improved late programming technique for a ROM in which a silicon nitride interlayer and its photoresist etch mask are used as an ion implantation mask.

Another object is to provide a high speed and high density ROM programmed late in its process of manufacture, without adding an extra mask to perform the programming.

This invention comprehends forming a ROM array of IGFETs on a silicon surface. Each IGFET is operable in that it has a source and drain region, a channel region and a polycrystalline silicon gate electrode. The gate electrode is readily penetrable by an ion beam. The ROM is programmed by covering the gate electrodes of selected IGFETs with a silicon nitride layer. Before removing the photoresist used to define the silicon nitride, the silicon surface is given a blanket ion implantation. The implantation significantly changes threshold voltage of the ROM IGFETs not covered by the silicon nitride layer. Silicon nitride is also placed around all contact areas, and contact windows etched in it when the silicon nitride is defined over the selected IGFETs.

A thick blanket insulating layer is then deposited onto the ROM array and corresponding contact windows etched in it without also etching it over IGFET gates. A conductor pattern, such as drain lines, is then formed on the insulating layer, and a passivation coating applied over the conductor pattern.

BRIEF DESCRIPTION OF THE DRAWING

Other objects, features and advantages of this invention will become more apparent from the following description of preferred examples thereof, and from the drawings.

FIGS. 1-7 and 8-11 show a series of sectional views along the same plane through two IGFET areas of a read-only memory (ROM) integrated circuit. These views show progressive stages in the manufacture of that integrated circuit. For clarity, background lines are omitted.

FIG. 7A shows a plan view of FIG. 7, with parts broken away to show underlying portions.

FIG. 7 shows a sectional view along the line 7—7 of FIG. 7A.

FIGS. 12-18 and 19-22 show a series of sectional views along the same plane through two IGFET areas of a second embodiment of a read-only memory (ROM) integrated circuit. Progressive stages in the manufacture of that circuit are shown. For clarity background lines are omitted.

FIG. 18A shows a plan view of FIG. 18, with parts broken away to show underlying portions.

FIG. 18 shows a sectional view along the line 18—18 in FIG. 18A.

DESCRIPTION OF THE PREFERRED EMBODIMENTS

Reference is now made to FIGS. 1-11 and 7A of the drawing, in which fabrication of two adjacent IGFETs is described. It is to be understood that these two IGFETs form merely one part of a matrix of IGFETs comprising a read-only memory such as hereinbefore described. It is to be understood that an IGFET read-only memory is a matrix comprising hundreds and even thousands of IGFETs arranged in an array of columns and rows, with adjacent rows of IGFETs sharing the same source region. All the IGFETs in the same row can share the same gate electrode. In a typical arrangement, the source regions of all IGFETs in a row are electrically in parallel by extending the source diffusion region between adjacent IGFET pairs in the row. In such instance, the integrated source regions appear as an elongated strip. To conserve space the same strip-like source region diffusion also serves as a source region for an adjacent row of IGFETs. In the FIG. 7A plan view, the resultant configuration appears as a strip-like diffusion area lying between two parallel gate electrodes. A discrete drain region is diffused in the wafer surface for each IGFET along the outer edges of the gate electrode pairs. The drain regions are aligned in columns. In section, two adjacent IGFETs appear as shown in FIGS. 1-11.

It is also to be recognized that the ROM IGFETs are typically formed on a mesa upstanding on the silicon surface, surrounded by more highly doped silicon surface areas which are covered by a relatively thick overlying field oxide. Such a construction is shown in U.S. Pat. No. 3,751,722 Richman. However, to focus attention more clearly on the programming improvement of this invention, and how ion implantation is associated with an overlying second level of polycrystalline silicon, applicants have elected to omit showing the mesa construction and the surrounding thick field oxide in FIGS. 1-11. However, in FIG. 7A, all of the silicon surface occupied by the source region, drain regions and gate electrode is a mesa. The balance is covered by a field oxide about 0.5–1.5 micrometers thick that overlies a more highly doped P-type surface region.

FIG. 1 shows a fragment of a mesa on a P-type silicon chip 10 where an IGFET pair from two adjacent ROM rows is to be formed. Chip 10 is one of many chips integrally formed in a repetitive pattern on a monocrystalline silicon wafer (not shown). The wafer has a diameter of about 7–10 centimeters and a thickness of about 0.4–0.6 millimeter. The wafer and therefore chip 10, would typically be homogeneous and has a resistivity of about 5–30 ohm-centimeters. The particular resistivity of course will depend on electrical characteristics of the finished devices desired. The wafer thickness preferred is ordinarily a function of the wafer diameter, with 7.6 centimeter wafers usually being about 0.4 millimeter thick.

Upper surface 12 of the silicon wafer containing chip 10 is lapped, polished and cleaned in the normal and accepted manner. A thin layer 14 of silicon dioxide, preferably about 500–1000 Angstroms thick is then formed on surface 12 of chip 10 as shown in FIG. 2. The thin silicon dioxide layer 14 can be formed by heating the silicon wafer containing chip 10 in dry or wet oxygen at a temperature of about 900°–1100° C. until the layer of silicon dioxide thickness is obtained. Time and treatment will depend upon the thickness desired and precise temperature of the treatment. However, a thickness of about 1000 Angstroms can be formed by heating in a dry oxygen for about 1 hour at a temperature of about 1050° C. This forms a thin silicon dioxide layer 14 which is suitable as a gate dielectric in an IGFET and which is readily penetrable by an ion beam having an energy greater than about 75 keV.

If desired, the wafer can then be given an ion implantation to adjust threshold voltage of the devices that are subsequently to be formed. Implantation with $^{11}B^+$ at a dosage of about $2 \times 10^{11}$ ions per square cm at about 35–75 keV is an example of what might be used. However, the particular dopant, dosage and power used can be varied as should be understood, depending upon the particular resistivity of the wafer, gate oxide thickness used, and threshold voltage desired in the resultant devices. Since such an implantation is optional, it is not shown in the drawing.

A blanket layer 18 of polycrystalline silicon is then deposited on the silicon dioxide layer 14 as shown in FIG. 3. The polycrystalline silicon layer 18 can be formed by chemical vapor deposition, evaporation, sputtering or the like. In general, it would have a thickness of about 4000–7000 Angstroms for self-aligning gate purposes. At least 4000 Angstroms is generally needed to obtain a low resistance gate. Above about 7000 Angstroms in thickness, the polycrystalline silicon layer produces undesirably high step heights. Also, thicknesses above 7000 Angstroms may require ion beam energies greater than about 150–200 keV to penetrate them. It should be recognized that the polycrystalline silicon layer 18 will be subsequently etched into a pattern of parallel bars that must be orthogonally crossed by an overlying metallization pattern 38.

The polycrystalline silicon layer 18 is preferably undoped, i.e., intrinsic, as deposited and then subsequently doped with an N-type impurity during the diffusion step which forms source and drain regions 20, 22 and 22′ in one of the succeeding process steps. It is preferred to dope the polycrystalline silicon layer 18 after it is deposited with phosphorus to a sheet resistivity of 20-50 ohms per square. On the other hand, there is no objection to so doping the polycrystalline silicon while it is being deposited. It is simply unnecessary. It should also be recognized that ion implantation can be used instead of diffusion to dope the polycrystalline silicon layer 18 and form the source and drain regions 20, 22 and 22′.

Referring now to FIG. 4 the undoped polycrystalline silicon layer 18 and the silicon dioxide layer 14 are then successively photolithographically etched to define discrete gate electrodes 18a and 18b, each of which has an underlying gate dielectric 14a and 14b. Gate electrode 18a has exposed sides 18a′ and top 18a″. Gate electrode 18b has exposed sides 18b′ and top 18b″. Layers 18 and 14 can be successively etched in much the same way as described in U.S. Pat. No. 3,475,234 Kerwin et al. For example, polycrystalline silicon layer 18 can be delineated by appropriately photomasking the wafer containing chip 10, and then immersing it in a mixture of hydrofluoric, nitric and acetic acids saturated with iodine. In the alternative, it can be plasma etched with $CF_4$ containing $O_2$. It is then rinsed in a hydrofluoride based etchant to remove the silicon dioxide layer over surface areas 12a and 12b. However, the particular manner in which the gate dielectric and the electrode are defined forms no part of this invention.

As can be seen better in FIG. 7A, gate electrodes 18a and 18b are in fact parallel strips of polycrystalline silicon. Surface 12a, and its underlying coextensive source region 20, is a continuous strip extending over the entire area between gate electrodes 18a and 18b. Gate electrodes 18a and 18b cover contiguous strips of surface 12 on opposite sides of surface strip 12a. Chip surface areas 12b are contiguous the surface strips covered by gate electrodes 18a and 18b. However, they are not strips. Instead, they are discrete rectangular areas when observed in plan view. Because background lines are not used in FIGS. 1-11, the individual surface areas 12b appear therein to be the same as the strip-like surface area 12a. However, many identical rectangular areas 12b would be spaced along the length of gate electrodes 18a and 18b. The individual rectangular areas are paired on opposing sides of gate electrodes 18a and 18b. The surface area under gate electrodes 18a and 18b, and the contiguous surface areas 12a and 12b all form one continuous mesa. The balance of the surface shown is covered by a thermally grown silicon dioxide field layer about 0.5-1.5 micrometers thick. When defining the gate electrodes 18a and 18b and the gate dielectric 14a and 14b, polycrystalline silicon layer 18 is removed from the field oxide. The field oxide is reduced only slightly in thickness, so that it still provides an effective diffusion mask for the next process step.

In the next process step, phosphorus is diffused into the gate electrodes 18a and 18b, and into the exposed surface portions 12a and 12b of chip 10. This produces a strip-like source region 20 and a plurality of discrete rectangular drain regions 22 and 22′, as indicated in the preceding paragraph. The phosphorus can be deposited onto and slightly diffused into the wafer by placing the wafer in a furnace maintained at a temperature of 950°-1050° C. About 3.5 liters per minute argon and 10-50 cc per minute oxygen flows through the furnace. After a 5 minute wafer preheat additional argon is bubbled through the phosphorus oxychloride at about 21° C. and bled into the furnace atmosphere at a rate of 10-100 cubic centimeters per minute. After a 5 minute period, the additional argon flow is discontinued. The wafer is left in the furnace for a third 5 minute period as a post-bake step. The wafer is heated to a temperature of 900°-1050° C. for about ½-2 hours in a moderately to strongly oxidizing atmosphere, to drive-in the phosphorus. The particular times, temperatures and atmospheres used for deposition and drive-in are obviously a matter of choice and are principally determined by the electrical characteristics of the device desired. Concurrently, a thin silicon dioxide coating 14c is reformed over the surface portions 12a and 12b, and also over the sides 18a′ and 18b′ and upper surfaces 18a″ and 18b″ of the polycrystalline silicon gate electrodes 18a and 18b. This coating 14c will range in thickness from about 100-1000 Angstroms and is of a thickness primarily to prevent deterioration of surface portions 12a and 12b during the aforementioned drive-in. The resultant product is as shown in FIG. 5.

FIG. 6 shows the wafer surface after a blanket layer of silicon nitride ($Si_3N_4$) 24 has been deposited over silicon dioxide layer 14c. The silicon nitride layer 24 is relatively thin, only about 200-1000 Angstroms in thickness. Below about 200 Angstroms the silicon nitride layer 24 may not be continuous, for example, by not completely covering the sides 18a′ and 18b′ of the respective gate electrodes 18a and 18b. Thicknesses greater than about 1000 Angstroms appear to be unnecessary and generally are to be avoided. Too thick a silicon nitride layer may be difficult to etch, etc. Also, when the silicon nitride thickness reaches about 2000 Angstroms, its difference is thermal expansion properties, from those of silicon, can cause silicon nitride cracks. The manner in which the silicon nitride layer 24 is deposited is not particularly critical. Any of the normal and accepted techniques can be used. Pyrolysis of a silicon-containing hydrocarbon gas at high temperatures is disclosed in U.S. Pat. No. 3,917,495 Horn. A glow discharge plasma reaction between silane and nitrogen with or without ammonia at about 300° C. is described in U.S. Pat. No. 4,091,406 Lewis for producing a silicon nitride coating that is not quite stoichiometric.

After depositing the blanket silicon nitride layer 24, source region contact window (not shown) and drain region contact windows 26 and 28 are photo-lithographically opened in it in the normal and accepted manner. A source region contact window is not shown in the Figures because it is not in the field of view. Instead, it is located at the end of the strip-like source diffusion region 20, where it serves as a common contact for both rows of IGFETs served by gate electrodes 18a and 18b. A low resistance electrical contact is subsequently made to the source region 20 through this window to provide a source region electrode. As can be seen by reference to FIG. 7A, contact windows 26 and 28 are opened over every drain region of the ROM. However, in addition, an additional window 30 is opened in the silicon nitride coating over the IGFET channel beneath the gate electrode 18b. Similar windows 30a are opened in the silicon nitride coating 24 over other selected IGFETs in the ROM array. The contact windows 26 and 28, as well as the ion implantation windows 30 and 30a, can be opened in the silicon nitride coating 24 by plasma etching with carbon tetrafluoride. Windows 30 and 30a are not present to serve any functional purpose themselves. They are only incidentally present, because the photoresist mask 32 serves a dual function. It is not used just as an etch mask to open contact windows in silicon nitride layer 24. It is also used as an ion implantation mask to encode the ROM. However, the opening of windows 30 and 30a is not objectionable. The silicon nitride is etched with an etchant that will not remove the previously formed thermal oxide 14c, which acts as an etch stop. Thus, gate electrodes under the windows 30 and 30a are not adversely affected. Then, a glass layer 34 will be subsequently applied over these windows 30 and 30a to give an added measure of protection. All of the IGFET channels, i.e., gates, exposed by windows 30 and 30a are channels of IGFETs selected to be a "0" in the resultant ROM code.

Since the photoresist 32 is also used as an ion implantation mask, as well as an etch mask, it is not removed immediately after etching silicon nitride layer 24. It is left on for the ion implantation step which follows next. All IGFET gates which are covered by photoresist 32 will be a "1" in the resultant ROM code. It should be appreciated that before ion implantation all ROM gates are operative, and therefore a potential "1" in the ROM code.

The wafer is then given a blanket ion implant as shown in FIG. 8. Implantation is performed with $^{11}B+$ in a dosage of about $5 \times 10^{13}$ ions per square centimeter at an energy of about 200 keV. Any energy sufficient to penetrate the exposed gate electrode 18b can be used, as for example at least about 125-150 keV, depending on the thickness of gate electrode 18b. The preferred maximum implant energy will produce a maximum doping just below surface 12 in the IGFET channel region under gate electrode 18b. In general, ion implant energies greater than about 200 keV are to be avoided. Ions with too much energy can penetrate photoresist 32, and adversely affect the IGFET channel under gate electrode 18a, and other IGFET channels not selected to be a "0".

Any implant dosage can be used that will raise threshold voltage of the channel under gate 18b to a voltage above the operating voltage selected for gate electrode 18b. The particular dosage needed will vary, of course, depending upon the operating potential selected for the gate electrode, the initial resistivity of the silicon wafer, gate electrode thickness, etc. In substance, one desires a dosage and energy sufficient to change the threshold voltage of the uncovered IGFETs to such an extent that they are unresponsive to a predetermined gate voltage. They would thus constitute a "0" in the ROM code. In the present example, we would raise threshold voltage of the uncovered IGFETs to a level significantly above the normal gate operating voltage of the ROM. For example, if the gate operating voltage of the ROM is approximately 5 volts, one would want to raise the threshold voltage of the uncovered IGFETs to 7 or 8 volts or even higher.

While we describe implanting the affected gate with $^{11}B+$, it is recognized that other P-type impurities could be used to increase IGFET channel P-type doping, and the attendant IGFET threshold voltage. It should also be recognized that if this example were a p-channel IGFET, instead of an n-channel IGFET, one would want to implant the channel with an N-type impurity to raise threshold voltage. Analogously the ROM described in this example of the invention comprises an array of enhancement-type IGFETs. One might choose to make a ROM array using depletion-type IGFETs.

After the ion implantation step of FIG. 8, the photoresist 32 is removed. A relatively thick blanket layer 34 of phosphorus doped glass is then deposited onto the wafer containing chip 10. The wafer is then heated to reflow the glass and provide a smooth upper surface 36 on glass layer 34 as shown in FIG. 9. The glass layer 34 can be deposited in any convenient manner, as for example by chemical vapor deposition of silane and phosphine. Any of the known and accepted practices and glass-like materials used to passivate and smooth out the surface of IGFET ROMs can be used in this invention too. The minimum thickness of glass which is needed to smooth out the upper surface of the wafer will vary. However, a thickness of about 5000–15,000 Angstroms is preferred. This is the same thickness that would be applied to integrated circuits whether this invention was used or not.

As mentioned, the glass layer 34 is of a composition which is reflowed to provide a smoother surface 36 on which to subsequently deposit a metallization pattern. Any silicate serving this function is considered a glass for purposes of this invention. It is preferred to use a glass having a melting point temperature that permits reflow at about 1000°–1100° C. in about 10 minutes. Higher temperatures and/or longer periods of time are generally not desired since they can produce additional unwanted diffusion of regions 20, 22 and 22' within chip 10.

Next, the glass layer 34 is photolithographically masked to open contact windows in it over the source and drain regions. As when etching silicon nitride layer 24, the contact window to the source region 20 is not shown since it is not in the field of view in the drawing. Glass layer 34 is etched in the normal and accepted manner, as for example with a hydrofluoric acid-based etchant. When the etchant has penetrated glass layer 34, a portion of the thermal oxide 14c is exposed within the contact openings previously etched in silicon nitride layer 24. The thermal oxide 14c etches at a much slower rate than the glass layer 34. However, etching can be continued because of the protective effect of the silicon nitride layer 24. It can be used to allow inadvertent widening of the glass contact openings without detrimental effect. FIG. 10 shows a contact window 26a etched in glass layer 34 and a contact window 26b etched in the thermal oxide layer 14c over drain region 22. Analogously, over drain region 22', a contact window 28a is opened in glass layer 34 and a contact window 28b is opened in the thermal oxide 14c. As can be seen in FIG. 7A, substantially all of the surface of chip 10 was previously covered with silicon nitride coating 24 except for contact windows 28 and ion implant windows 30. Where present, this coating serves to prevent inadvertent electrical shorts due to unexpected lateral etching of the glass layer 34 or pin-holing. Hence, yields should be increased.

A metallization pattern 38 is then formed on the upper surface 36 of glass layer 34 as shown in FIG. 11. Any of the normal and accepted metals and methods of forming the pattern can be used. For example, the metallization pattern 38 can be formed by evaporating a blanket layer of aluminum onto the entire upper surface of the slice. The metal layer fills the contact windows, including contact windows 26, 26a, 26b, 28, 28a and 28b for drain regions 22 and 22'. The metal contacts the wafer surfaces 12a (not shown) and 12b to make a low resistance electrical connection with a source region 20 and drain regions 22 and 22'. Other metals than pure aluminum can be used in forming the metallization pattern 38. Any of the normal and accepted metals can be used, as for example, aluminum-silicon alloy, gold, silver, alone or in a multiplicity of layers, just as in any other ROM.

The blanket metal layer used in forming the metallization pattern 38 can be photolithographically etched in a normal and accepted manner to define source and drain electrodes. Since the source electrode is not in the plane of FIG. 11, it is not shown. The drain electrode is, in fact, a strip running along a column of drain regions in the ROM array, orthogonal to gate electrodes 18a and 18b. Since the drain regions are arrayed in parallel columns, the drain strips are a pattern of parallel strips, as previously indicated.

Reference is now made to FIGS. 12–18, 18A, and 19–22 which illustrate the manufacturing sequence for an alternative embodiment of this invention. The sequence is essentially the same, as hereinbefore described for the first embodiment of this invention. It differs in that the silicon nitride interlayer 54 is a series of patches selectively distributed over the chip surface, rather than being a substantially continuous coating 24 having openings selectively distributed in it. Thus, the process steps are performed in exactly the same manner as described for the preceding example of this invention.

In brief, the alternative embodiment of this invention illustrated in FIGS. 12–18, 18A, and 19–22 is formed as hereinafter described. FIG. 12 shows a mesa portion of a P-type silicon chip 40 having a surface 42 on which two adjacent IGFETs of a ROM array are to be formed. A thermal oxide layer 44 is then formed on surface 42 and a layer of polycrystalline silicon 48 deposited on thermal oxide layer 44, as successively shown in FIGS. 13 and 14. These two layers are then delineated to form gate electrodes 48a and 48b along with their respective underlying gate oxide portions 44a and 44b. Source region 50 and drain regions 52 and 52' are then diffused into chip 40, and a thermal oxide 44c grown on the exposed chip and gate electrode surfaces.

A blanket silicon nitride coating 54 is then deposited onto chip 40 and etched. However, the pattern which is etched differs from that described for the preceding example of the invention. This difference is best observed by comparing FIGS. 7A and 18A.

In order to delineate the silicon nitride coating 54, a photoresist etch mask 56 is formed on top of the silicon nitride coating 54. The photoresist mask includes a patch-like portion 56a that extends over the channel region of FIG. 18 beneath gate electrode 48a. It also has a portion that extends over and surrounds the contact area over drain region 52. A smaller patch 56a surrounds the contact area over drain region 52'. Patch 56a completely covers the channel region of the IGFET shown in FIG. 18 under gate electrode 48a. Patch 56a protects that channel from ion implantation. Patch 56b is used to provide some added tolerance when etching contacts to the ROM drain region 52', as a protection against excessive lateral etching when etching through the subsequently applied glass layer. As seen in FIG. 18A, an additional silicon nitride path 54b is used over the gate region of a different IGFET, one that is under gate electrode 48b. However, it does not appear in FIG. 18, because background lines are omitted. Analogously, FIG. 18A shows a series of additional patches 56d over the balance of the drain regions in the ROM which are not covered by ion implantation protective patches 56a and 56c. When the silicon nitride coating 54 is delineated, using such a mask, corresponding silicon nitride patches 54a and 54b are formed, as seen in FIG. 18. In addition, corresponding silicon nitride patches 54c and 54d (not shown) would be formed.

After the silicon nitride coating 54 is delineated, the chip is given a blanket ion implantation to turn off those IGFETs not covered by protective photoresist patches 56a, 56c or 56d. The boron implantation is illustrated in FIG. 19. It can be seen, then, that the photoresist mask 56 used for etching the silicon nitride coating 54 serves a dual purpose in this embodiment of the invention too. It is used to etch contact windows 58 in the silicon nitride coating 54. In addition, it is also left over selected IGFET gates to block ion implantation into the channel regions of those selected IGFETs.

The photoresist mask 56 is then removed from the surface of the ROM array after the boron implantation of FIG. 19. As shown in FIG. 20, a blanket layer 60 of phosphosilicate glass is then deposited over the ROM array and is reflowed to provide a smooth upper surface 62. Contact windows are then etched in the glass layer and in the underlying thermal oxide, corresponding to the previously etched windows 58 in the silicon nitride layer 54. A metallization pattern 64 is then deposited on top of the glass layer 60 filling the contact windows and making contact with the appropriate regions 50, 52 and 52' of chip 40. As with the preceding embodiment of the invention only contact with drain regions 52 and 52' are shown, since contact with source region 50 is out of the field of view of the drawing.

The embodiments of the invention in which an exclusive property or privilege is claimed are defined as follows:

1. A method of making a high speed, high density read-only memory and encoding it in later steps of the method comprising:
   forming on a semiconductor surface, an operative IGFET array having an overlying polycrystalline silicon gate electrode pattern;
   depositing a first blanket insulating layer onto said array;
   forming on said first layer a mask covering array contact areas and channels of predetermined IGFETs desired to be operative to an intended gate electrode operating voltage, said contact areas having openings for etching contact windows;
   etching said array to remove said first layer from all parts of said array not covered by said mask;
   ion implanting said array, to significantly selectively alter threshold voltage of all IGFETs therein not covered by said mask, whereby only said predetermined IGFETs in said array are responsive to said intended gate voltages;
   removing said mask and covering said array with a second blanket insulating layer that is preferentially etchable with respect to said first layer;
   etching contact windows in the second layer without etching windows in it over any IGFET channels or unintentionally exposing gate electrode edges; and
   forming an array output conductor pattern on said second insulating layer, whereby said pattern may cross said gate electrodes over said channels and make contact with said array while maintaining minimal gate-output parasitic capacitance and electrical shorts.

2. A method of making a high speed, high density read-only memory and encoding it in later steps of the method comprising:

forming on a semiconductor surface, an operative IGFET array having an overlying polycrystalline silicon gate electrode pattern;

depositing a first blanket insulating layer onto said array;

forming on said first layer a mask having first openings for etching contact windows to said array but which also includes second openings over channels of predetermined IGFETs in said array;

etching said first layer to open windows therein corresponding to said mask openings;

significantly selectively altering threshold voltage of said predetermined IGFETs by ion implantation of their channels through the etch mask second openings, whereby said predetermined IGFETs become unresponsive at an intended gate electrode operating voltage;

covering said array with a second blanket insulating layer that is preferentially etchable with respect to said first layer;

etching contact windows in the second layer, without etching windows in the second layer over said predetermined IGFET channels or unintentionally exposing gate electrode edges; and forming an array output conductor pattern on said second insulating layer whereby said pattern may cross said gate electrodes over said predetermined IGFET channels to make contact with array IGFETs without incurring significant gate-output parasitic capacitance and electrical shorts.

3. A method of making a high speed, high density read-only memory and encoding it in later steps of the method comprising:

forming on a semiconductor surface, an operative IGFET array having an overlying polycrystalline silicon gate electrode pattern;

depositing a blanket silicon nitride layer onto said array;

forming on said silicon nitride layer a mask having first openings for etching contact windows in said silicon nitride layer and second openings over the polycrystalline silicon gate electrodes of predetermined IGFET channels in said array for ion implantation of said predetermined channels;

etching said array to open said contact windows in said silicon nitride layer;

giving said array a blanket ion implant before removing said mask from said array, whereby the predetermined IGFET channels exposed within said mask second openings are encoded as a "zero" in said array and the balance of said array IGFETs remain as a "one";

removing the said mask and covering said array with a blanket glass layer;

etching contact windows in the glass layer without etching windows in the second layer over said predetermined IGFET channels or unintentionally exposing gate electrode edges; and forming an array output conductor pattern on said second insulating layer that crosses said gate electrodes over said channels to make contact with array IGFETs while maintaining gate-output parasitic capacitance and electrical shorts at a minimum.

4. A method of making a high speed, high density read-only memory and encoding it in later steps of the method comprising:

forming on a semiconductor surface, an operative array of n-channel IGFETs having an overlying polycrystalline silicon gate electrode pattern;

depositing a blanket silicon nitride layer onto said array;

forming on said first layer a photoresist mask having contact window openings and ion implantation openings, the latter opening being over channels of predetermined IGFETs in said array that are intended to be encoded as a "zero" in said memory;

etching said array to open contact windows in said silicon nitride layer, but which incidentally also nondeleteriously opens windows over channels of said predetermined IGFETs;

before removing said mask from said array, subjecting the array to an implantation of boron ions at least about $5 \times 10^{13}$ ions/cm$^2$ and 125 keV that is sufficient to raise threshold voltage of said predetermined IGFETs above about 5 volts, and thereby make them unresponsive to gate operating voltages below about 5 volts;

after removing said mask, depositing a blanket layer of phosphosilicate glass onto said array and reflowing it;

etching said array to open contact windows in said glass layer corresponding to the contact windows opened in the silicon nitride layer, without also opening windows over the IGFET channels, effective to reserve a relatively thick dielectric coating over gate electrodes of said channels and minimize parasitic capacitance effects with an overlying metallization layer; and forming an array output conductor pattern on said glass layer that crosses said gate electrodes over said encoded channels without incurring a significant parasitic capacitance.

5. A method of making a high speed, high density read-only memory and encoding it in later steps of the method comprising:

forming an IGFET array on a semiconductor surface, with all IGFETs in the array having similar threshold voltages and polycrystalline silicon gate electrode pattern overlying the array;

depositing a blanket silicon nitride layer onto said array;

forming on said silicon nitride layer a contact mask that includes a plurality of patches, some which are over array contact areas and have silicon nitride and others of which have no such openings and are disposed over channels of predetermined IGFETs in said array;

etching said array to open contact windows in said silicon nitride within said mask openings;

ion implanting said array, to significantly alter threshold voltage of IGFETs whose channels are not covered by said mask patches, and thereby encode said array;

covering said encoded array with a blanket layer of phosphosilicate glass;

etching contact windows in the phosphosilicate glass layer without concurrently also etching windows in the phosphosilicate glass layer over substantially any IGFET channels in the array or unintentionally exposing gate electrode edges thereof; and forming an array output conductor pattern on said second insulating layer that crosses said gate electrodes over said channels to make contact with drain regions of array IGFETs, without incurring significant gate-output parasitic capacitance and electrical shorts.

* * * * *